(12) United States Patent
Miura et al.

(10) Patent No.: US 12,334,289 B2
(45) Date of Patent: Jun. 17, 2025

(54) RELAY CONTROL DEVICE AND METHOD OF CONTROLLING RELAY CONTROL DEVICE

(71) Applicant: Hitachi Astemo, Ltd., Hitachinaka (JP)

(72) Inventors: Hikaru Miura, Hitachinaka (JP); Tatsumi Yamauchi, Hitachinaka (JP); Mutsumi Kikuchi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 246 days.

(21) Appl. No.: 18/009,432

(22) PCT Filed: Feb. 5, 2021

(86) PCT No.: PCT/JP2021/004265
§ 371 (c)(1),
(2) Date: Dec. 9, 2022

(87) PCT Pub. No.: WO2021/250935
PCT Pub. Date: Dec. 16, 2021

(65) Prior Publication Data
US 2023/0230788 A1     Jul. 20, 2023

(30) Foreign Application Priority Data

Jun. 12, 2020   (JP) ................................ 2020-102587

(51) Int. Cl.
*G01R 31/327*     (2006.01)
*H01H 47/00*      (2006.01)

(52) U.S. Cl.
CPC ....... *H01H 47/002* (2013.01); *G01R 31/3278* (2013.01); *H01H 2047/003* (2013.01)

(58) Field of Classification Search
CPC ......... G01R 31/3278; H01H 2047/003; H01H 47/002
See application file for complete search history.

(56) References Cited

U.S. PATENT DOCUMENTS

| 11,418,042 B2 * | 8/2022 | Yamauchi ............. B60L 3/0046 |
| 2018/0238968 A1 * | 8/2018 | Wada .................... F02N 11/087 |

(Continued)

FOREIGN PATENT DOCUMENTS

| CN | 110794253 A | 2/2020 | |
| EP | 3699617 B1 * | 2/2024 | ................ B60L 3/04 |

(Continued)

OTHER PUBLICATIONS

International Search Report with English Translation and Written Opinion dated May 25, 2021 in corresponding International Application No. PCT/JP2021/004265.

*Primary Examiner* — Sisay G Tiku
(74) *Attorney, Agent, or Firm* — Foley & Lardner LLP

(57) ABSTRACT

In a case where a load current flows in an energized state where a power supply is connected to a load, it is assumed that a measured voltage fluctuates due to a voltage drop caused by contact resistance of a relay contact, and thus the relay state cannot be accurately diagnosed. A relay control device that controls a relay connected between a secondary battery and a load device calculates, in a failure diagnosis during energization with the relay being closed, a contact resistance value of the relay based on a voltage applied to the relay and a current flowing through the secondary battery, and determines a first threshold set as a variable value in accordance with a temperature change amount of the relay and compares the calculated contact resistance value with the first threshold to diagnose a failure of the relay.

8 Claims, 6 Drawing Sheets

(56) References Cited

U.S. PATENT DOCUMENTS

2019/0036325 A1* 1/2019 Jyumonji ......... G01R 19/16528
2021/0402938 A1* 12/2021 Lee .................... B60R 16/0231
2024/0110982 A1* 4/2024 Kim .................... G01R 31/387

FOREIGN PATENT DOCUMENTS

| EP | 2988138 B1 | * | 3/2024 | ............... B60L 3/12 |
| JP | H03-87672 A | | 4/1991 | |
| JP | 2008-92656 A | | 4/2008 | |
| JP | 2013219955 A | * | 10/2013 | |
| JP | 2019-174165 A | | 10/2019 | |
| JP | 2021087280 A | * | 6/2021 | |
| WO | WO-2017043238 A1 | * | 3/2017 | ............ B60L 3/0046 |
| WO | WO-2023021744 A1 | * | 2/2023 | .......... H02J 7/00032 |

* cited by examiner

RELAY CONTROL DEVICE AND METHOD OF CONTROLLING RELAY CONTROL DEVICE

TECHNICAL FIELD

The present invention relates to a relay control device and a method of controlling the relay control device.

BACKGROUND ART

A conventionally known battery system includes a chargeable and dischargeable secondary battery and supplies power to a device mounted on an automobile or the like. In such a battery system, relays are generally provided on a positive electrode terminal side and a negative electrode terminal side of the secondary battery respectively in order to switch an energized state between the secondary battery and the device.

PTL 1 discloses a power supply device that detects welding of relays provided respectively on a positive electrode terminal side and a negative electrode terminal side of a battery for running of a vehicle. This power supply device measures, when a positive electrode-side relay and a negative electrode-side relay are all in an open state, a voltage between a high potential output terminal side of the positive electrode-side relay and a negative electrode terminal side of the secondary battery of the negative electrode-side relay and a voltage between a low potential output terminal side of the negative electrode-side relay and the positive electrode terminal side of the secondary battery of the positive electrode-side relay, and determines whether the positive electrode-side relay and the negative electrode-side relay are welded, based on the measurement results.

CITATION LIST

Patent Literature

PTL 1: JP 2008-92656 A

SUMMARY OF INVENTION

Technical Problem

In the device disclosed in PTL 1, when a load current flows in a state where both the positive electrode-side relay and the negative electrode-side relay are simultaneously connected, that is, in an energized state where a power supply is connected to a load, a measured voltage fluctuates due to a voltage drop caused by a contact resistance of a relay contact, and thus the relays cannot be accurately diagnosed.

Solution to Problem

A relay control device of the present invention that controls a relay connected between a secondary battery and a load device calculates, in a failure diagnosis during energization with the relay being closed, a contact resistance value of the relay based on a voltage applied to the relay and a current flowing through the secondary battery, and determines a first threshold set as a variable value in accordance with a temperature change amount of the relay and compares the calculated contact resistance value with the first threshold to diagnose a failure of the relay.

A method of controlling a relay control device according to the present invention that controls a relay connected between a secondary battery and a load device includes calculating, in a failure diagnosis during energization with the relay being closed, a contact resistance value of the relay based on a voltage applied to the relay and a current flowing through the secondary battery, and determining a first threshold set as a variable value in accordance with a temperature change amount of the relay and comparing the calculated contact resistance value with the first threshold to diagnose a failure of the relay.

Advantageous Effects of Invention

According to the present invention, the contact resistance of the relay can be accurately calculated even during energization, and failure diagnosis of the relay can be accurately performed.

DESCRIPTION OF EMBODIMENT

Figure 1:
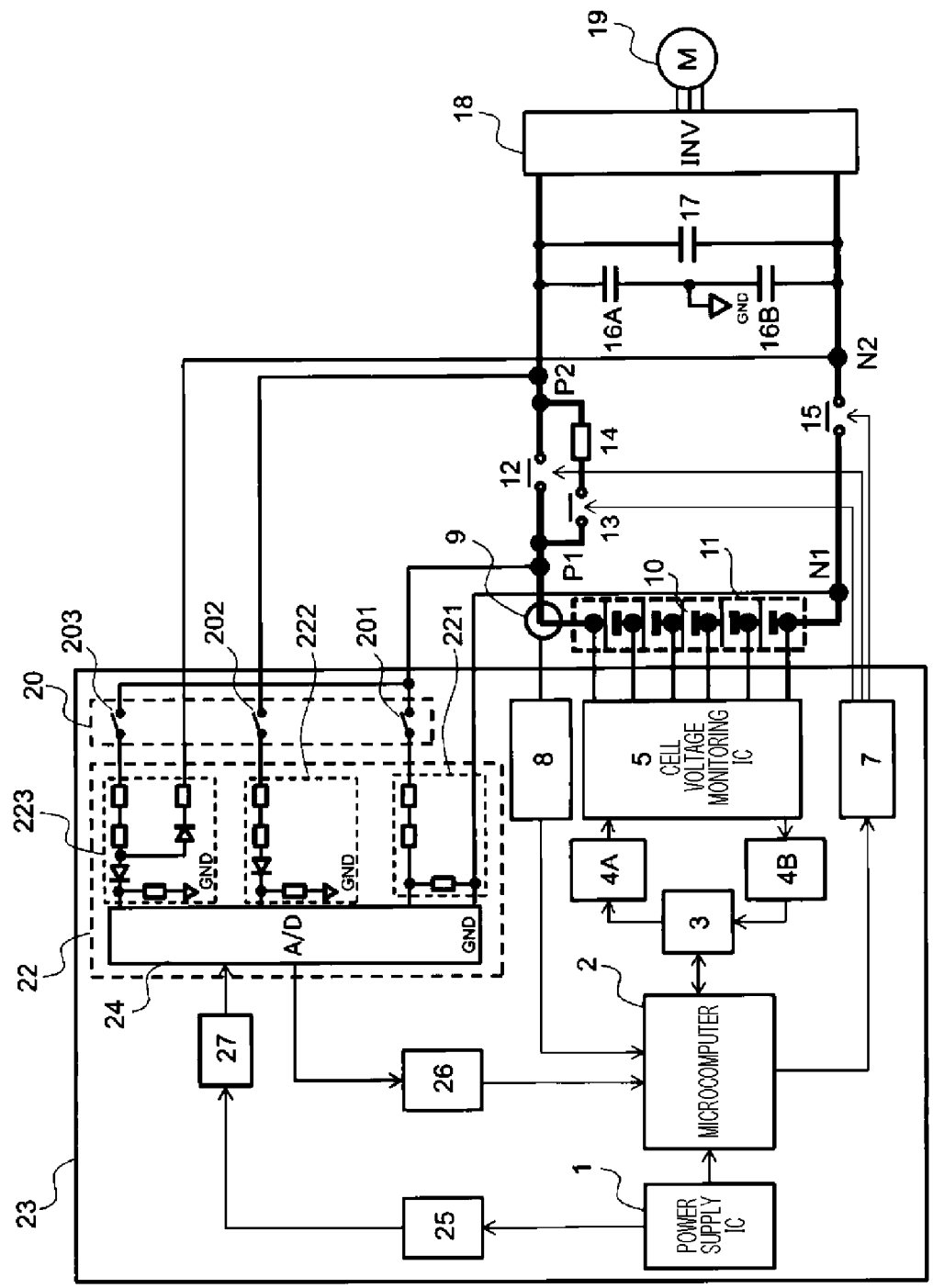
FIG. 1 is a diagram illustrating a configuration of a battery system including a battery monitoring device.

Hereinafter, an embodiment of the present invention will be described with reference to the drawings. FIG. 1 is a diagram illustrating a configuration of a battery system including a battery monitoring device 23 according to an embodiment of the present invention. In the battery system illustrated in FIG. 1, the battery monitoring device 23 is connected to a battery pack 11 which is a secondary battery, and measures a voltage of each battery cell 10 constituting the battery pack 11 to monitor the battery pack 11. Further, the battery monitoring device 23 monitors the states of a positive electrode-side main relay 12 and a negative electrode-side main relay 15 disposed between the battery pack 11 and an inverter 18. In the following description, the positive electrode-side main relay 12 and the negative electrode-side main relay 15 may be collectively referred to as relays.

The battery pack 11 is connected to the inverter 18 as a load device via the positive electrode-side main relay 12, a precharge relay 13, and the negative electrode-side main relay 15. The positive electrode-side main relay 12 includes contacts respectively on a positive electrode terminal side and an inverter 18 side of the battery pack 11, and energizes or de-energizes (interrupts) these contacts. The negative electrode-side main relay 15 includes contacts respectively on a negative electrode terminal side and the inverter 18 side of the battery pack 11, and energizes or de-energizes (interrupts) these contacts. A series circuit of the precharge relay 13 and a precharge resistor 14 is connected in parallel with the positive electrode-side main relay 12. Similarly to the positive electrode-side main relay 12, the precharge relay 13 includes contacts respectively on the positive electrode terminal side and the inverter 18 side of the battery pack 11, and is energized by closing the contacts or is interrupted by opening the contacts.

The inverter 18 converts DC power supplied from the battery pack 11 into AC power and outputs the AC power to a motor 19 to drive the motor 19. At this time, the inverter 18 acts as a load of the battery pack 11. Y capacitors 16A and 16B and an X capacitor 17 connected in series are connected to the battery pack 11 in parallel with the inverter 18.

The battery monitoring device 23 includes a power supply integrated circuit (IC) 1, a microcomputer 2, a communication interface circuit 3, isolated communication elements 4A and 4B, a cell voltage monitoring IC 5, a relay control unit 7, a current sensor interface circuit 8, a current sensor 9, a sensor connection changeover switch group 20, a high-voltage measurement interface circuit group 22, an isolated power supply 25, an isolated communication element 26, and a low dropout linear regulator (LDO) 27.

The power supply IC 1 supplies power for operating the microcomputer 2 to the microcomputer 2. The microcomputer 2 communicates with the cell voltage monitoring IC 5 via the communication interface circuit 3 and the isolated communication elements 4A and 4B to instruct the cell voltage monitoring IC 5 to measure the voltages of the battery cells 10 of the battery pack 11, and acquires the measurement results from the cell voltage monitoring IC 5. The microcomputer 2 instructs, based on the voltage measurement results of the battery cells 10 acquired from the cell voltage monitoring IC 5, the cell voltage monitoring IC 5 to perform cell balancing for reducing voltage variation among the battery cells 10 as necessary. In addition, the microcomputer 2 acquires a charge and discharge current (that is, a current flowing through the battery pack 11 which is a secondary battery) I_pack of the battery pack 11 measured by the current sensor 9 via the current sensor interface circuit 8. The acquisition of the charge and discharge current I_pack is preferably performed in synchronization with the acquisition of a total voltage (first voltage to be described later) of the battery pack 11.

The relay control unit 7 switches connection states of the positive electrode-side main relay 12, the negative electrode-side main relay 15, and the precharge relay 13 in accordance with an instruction from the microcomputer 2. When starting energization from the battery pack 11 to the inverter 18, the microcomputer 2 instructs the relay control unit 7 to energizes the negative electrode-side main relay 15 and the precharge relay 13, and then energize the positive electrode-side main relay 12 to open the precharge relay 13. As a result, first, charging of the X capacitor 17 is started in a state where an inrush current is limited by the precharge resistor 14, and after the X capacitor 17 is sufficiently charged, power is supplied from the battery pack 11 to the inverter 18.

The power supply IC 1 and the microcomputer 2 mounted to the battery monitoring device 23 have a detection circuit for detecting abnormality of an internal circuit. In a case where an abnormality is detected by any one of the detection circuits and overcharge or overdischarge might occurs in at least one battery cell 10 in the battery pack 11, the relay control unit 7 is turned off, and the positive electrode-side main relay 12, the negative electrode-side main relay 15, and the precharge relay 13 are forcibly opened. This protects the battery pack 11 from overcharge and overdischarge.

Further, the microcomputer 2 mounted on the battery monitoring device 23 diagnoses failures of relays such as the positive electrode-side main relay 12 and the negative electrode-side main relay 15 connected between the battery pack 11 as a secondary battery and the inverter 18 as a load device or the motor 19. Hereinafter, a case where the microcomputer 2 operates as a relay control device will be described as an example.

The sensor connection changeover switch group 20 includes a plurality of changeover switches 201, 202, and 203. The changeover switches 201, 202, and 203 switch connection states between both contacts of the positive electrode-side main relay 12 and the negative electrode-side main relay 15 and three interface circuits 221, 222, and 223 provided in the high-voltage measurement interface circuit group 22. The changeover switch 201 is connected between the contact (hereinafter, referred to as a first positive electrode contact) P1 of the positive electrode-side main relay 12 provided on the positive electrode terminal side of the battery pack 11 and the interface circuit 221. The changeover switch 202 is connected between the contact (hereinafter, referred to as a second positive electrode contact) P2 of the positive electrode-side main relay 12 provided on a side of the inverter 18 and the interface circuit 222. The changeover switch 203 is connected between the first positive electrode contact P1 and the interface circuit 223. Note that the switching states of the changeover switches 201, 202, and 203 are controlled by the microcomputer 2.

The high-voltage measurement interface circuit group 22 includes the above-described three interface circuits 221, 222, and 223 and an analog-digital (A/D) converter 24. A voltage (hereinafter, referred to as a first voltage) between the first positive electrode contact P1 and a contact (hereinafter, referred to as a first negative electrode contact) N1 of the negative electrode-side main relay 15 provided on the negative electrode terminal side of the battery pack 11 is input to the interface circuit 221 via the changeover switch 201. The interface circuit 221 converts the first voltage into a voltage $V1\_ad$ within an input voltage range of the A/D converter 24 and outputs it to the A/D converter 24.

A voltage (hereinafter, referred to as a second voltage) between the second positive electrode contact P2 and the first negative electrode contact N1 (GND) is input to the interface circuit 222 via the changeover switch 202. The interface circuit 222 converts the second voltage into a voltage $V2\_ad$ within the input voltage range of the A/D converter 24 and outputs it to the A/D converter 24.

A voltage (hereinafter, referred to as a third voltage) between the first positive electrode contact P1 and a contact (hereinafter, referred to as a second negative electrode contact) N2 provided on the side of the inverter 18 of the negative electrode-side main relay 15 is input to the interface circuit 223 via the changeover switch 203. The interface circuit 223 converts the third voltage into a voltage $V3\_ad$ within the input voltage range of the A/D converter 24 and outputs it to the A/D converter 24. The A/D converter 24 converts the input voltages $V1\_ad$, $V2\_ad$, and $V3\_ad$ into digital values, and outputs the digital values to the microcomputer 2 via the isolated communication element 26.

The microcomputer 2 individually controls the changeover switches 201, 202, and 203, and switches, as desired, the connection timing of the interface circuits 221, 222, and 223 to measure the first to third voltages. The microcomputer 2 compares the measured first voltage with a total voltage value (that is, a total voltage of the battery pack 11) obtained by summing individual voltage values of the battery cells 10 measured by the cell voltage monitoring IC 5 to diagnose consistency of a measurement result of a voltage measurement system (hereinafter, referred to as a first voltage measurement system) of the first voltage.

The microcomputer 2 calculates a contact resistance R12_cont of the positive electrode-side main relay 12 based on the voltages V1_ad and V2_ad obtained by measuring the first voltage and the second voltage, and the current I_pack flowing through the battery pack 11, which is the secondary battery, measured by the current sensor 9. In a similar manner, the microcomputer 2 calculates a contact resistance R15_cont of the negative electrode-side main relay 15 based on the voltages V1_ad and V3_ad obtained by measuring the first voltage and the third voltage, and the measured current I_pack.

The isolated power supply 25 supplies the power isolated from the power supply IC 1 to the LDO 27, based on the power supplied from the power supply IC 1. The LDO 27 generates operation power for the A/D converter 24 based on the power supplied from the isolated power supply 25, and supplies the operation power to the A/D converter 24.

Calculation of Contact Resistance of Positive Electrode-side Main Relay

Figure 2:
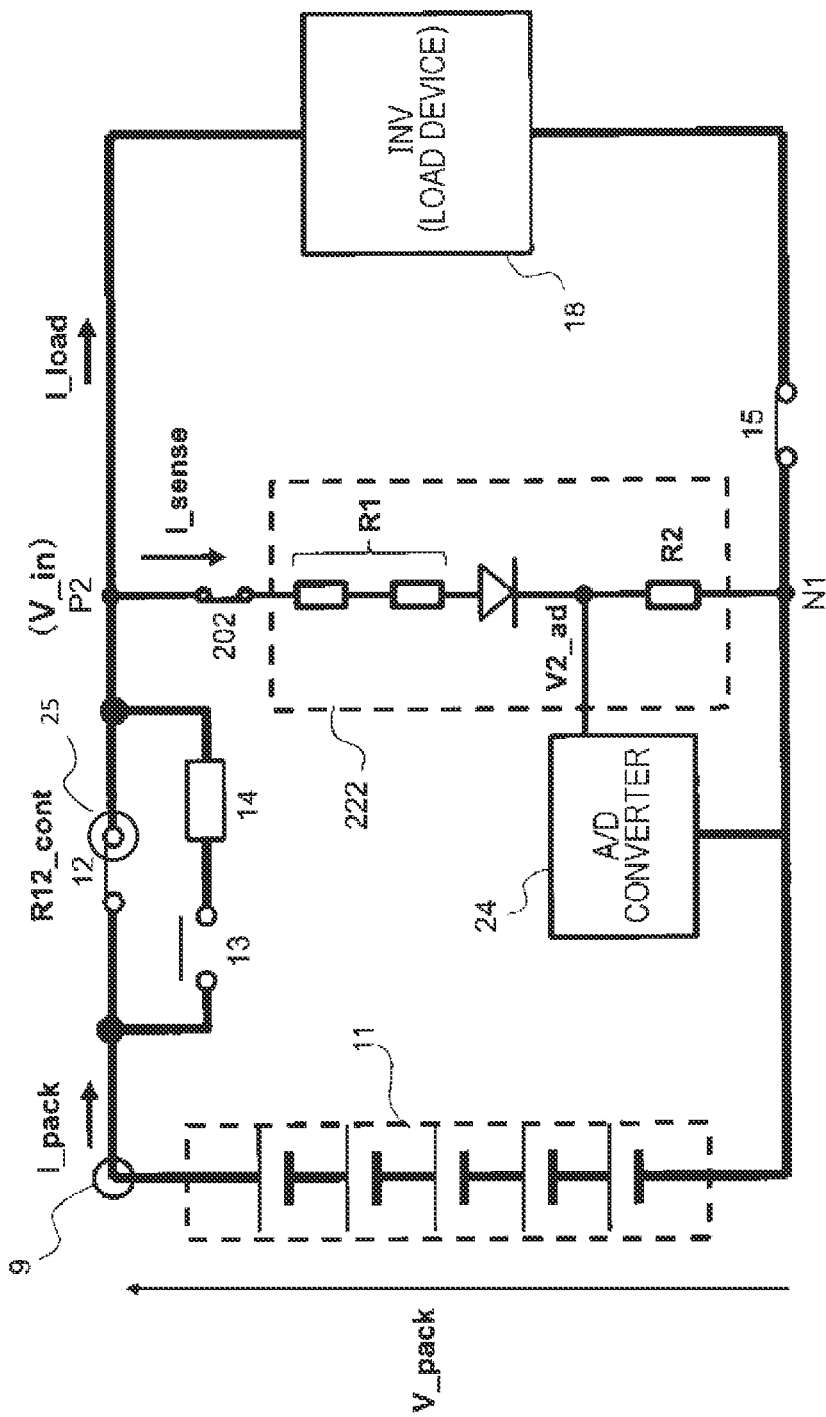
FIG. 2 is a diagram illustrating a second voltage measurement system.

Next, calculation of the contact resistance R12_cont of the positive electrode-side main relay 12 and the contact resistance R15_cont of the negative electrode-side main relay 15 will be described. First, the calculation of the contact resistance R12_cont of the positive electrode-side main relay 12 will be described with reference to FIG. 2. FIG. 2 illustrates a voltage measurement system (hereinafter, referred to as a second voltage measurement system) of the voltage (that is, the second voltage) between the second positive electrode contact P2 and the first negative electrode contact N1. The second voltage measurement system includes the changeover switch 202, the interface circuit 222, and the A/D converter 24. In FIG. 2, V_pack indicates a voltage of the battery pack 11, I_load is a current flowing through the inverter 18 which is the load device, and I_sense indicates a current flowing through the second voltage measurement system.

In a case where a sensor input voltage (a voltage between the second positive electrode contact P2 and the first negative electrode contact N1) of the second voltage measurement system is V_in, V_in is expressed by the following equation (1). The sensor input voltage V_in is divided by the resistances R1 and R2, and the voltage V2_ad of the resistance R2 is measured by the A/D converter 24. In this case, when the conversion coefficient of the interface circuit 222 is $1/\alpha 2$, $V\_in = \alpha 2 \times V2\_ad$, and thus $\alpha 2 = (R1+R2)/R2$.

$$V\_in = V2\_ad \times (R1+R2)/R2 \quad (1)$$

Further, the sensor input voltage V_in is obtained by subtracting a voltage drop due to the contact resistance R12_cont of the positive electrode-side main relay 12 from the voltage V_pack of the battery pack 11 obtained by measuring the first voltage. Therefore, the contact resistance R12_cont is expressed by the following equation (2).

$$R12\_cont = (V\_pack - V\_in)/I\_pack \quad (2)$$

When the relationship of $V\_in = \alpha 2 \times V2\_ad$ described above is used in the equation (2), the contact resistance R12_cont is expressed by the following equation (3).

$$R12\_cont = (V\_pack - \alpha 2 \times V2\_ad)/I\_pack \quad (3)$$

In the equation (3), V_pack is the voltage of the battery pack 11 and is equal to the first voltage described above. Assuming that a conversion coefficient of the interface circuit 221 (see FIG. 1) that converts the first voltage into the voltage V1_ad is $1/\alpha 1$, $V\_pack = \alpha 1 \times V1\_ad$, and thus the equation (3) can be rewritten as equation (4).

$$R12\_cont = (\alpha 1 \times V1\_ad - \alpha 2 \times V2\_ad)/I\_pack \quad (4)$$

That is, the microcomputer 2 can accurately calculate the contact resistance R12_cont of the positive electrode-side main relay 12 even in the energized state by applying the measured voltages V1_ad and V2_ad and the current I_pack to the equation (4). This calculation can be performed in both cases where the current I_load flows and does not flow through the inverter 18. Since I_pack=I_load+I_sense, I_pack in the equation (4) is equal to I_sense when the current I_load does not flow through the inverter 18. Since the current I_sense flowing through the second voltage measurement system can be calculated by the following equation (5), I_sense calculated by the equation (5) can be used as I_pack in the equation (4) during non-energization. As described above, even when the current I_pack is very small and cannot be accurately detected by the current sensor 9, the contact resistance R12_cont can be accurately calculated by using the current I_sense calculated by the equation (5).

$$I\_sense = V2\_ad/R2 \quad (5)$$

The contact resistance R12_cont can be similarly calculated also in a regenerative state by the motor 19 and the inverter 18, that is, in a charging state. In this case, the sensor input voltage V_in is obtained by adding the voltage drop due to the contact resistance R12_cont of the positive electrode-side main relay 12 to the voltage V_pack of the battery pack 11 obtained by measuring the first voltage, and thus the above-described equation (2) can be replaced by the following equation (2b).

$$R12\_cont = -(V\_pack - V\_in)/I\_pack \quad (2b)$$

The equations (1) and (5) relating to V_in and I_sense hold also in the charging state. That is, the microcomputer 2 can accurately calculate the contact resistance R12_cont of the positive electrode-side main relay 12 also in the charging state by applying the measured voltages V1_ad and V2_ad, the current I_pack, and the current I/sense calculated by the equation (5) to the equation (4).

Updating of Threshold of Positive Electrode-side Main Relay

Next, updating of a threshold during I_pack energization will be described. After the positive electrode-side main relay 12 is energized, an initial value R12_cont_ini of the contact resistance R12_cont measured immediately before the current energization is stored in an internal memory of the microcomputer 2.

The power consumption of the contact resistance R12_cont during the current I_pack energization can be calculated by the equation (6).

$$Power\_R12\_cont = R12\_cont\_ini \times I\_pack^2 \quad (6)$$

The microcomputer 2 can calculate a calorific value Q1 of the contact resistance R12_cont based on the equation (7) by integrating the power consumption calculated by the equation (6).

$$Q1 = \int Power\_R12\_cont(t)dt \quad (7)$$

A temperature change amount $\Delta T$ of the positive electrode-side main relay 12 can be estimated by the equation (8) by using the calculated calorific value Q1 and a temperature conversion parameter K recorded in advance in the microcomputer 2. The temperature conversion parameter K is calculated using a heat dissipation parameter such as thermal conductivity under a system mounting condition.

$$\Delta T = Q1 \times K \tag{8}$$

The microcomputer 2 calculates a temperature drift $f(\Delta T)$ of the contact resistance value based on the calculated temperature change amount $\Delta T$ and the contact resistance initial value R12_cont_ini using a temperature characteristic table of the contact resistance R12_cont internally recorded in advance or a conversion function. The temperature drift $f(\Delta T)$ is a function in which the temperature change amount $\Delta T$ is a variable.

The microcomputer 2 obtains a threshold Rth_x in which the temperature drift $f(\Delta T)$ of the contact resistance R12_cont is added in accordance with an equation (9) for adding the calculated temperature drift $f(\Delta T)$ to an initial threshold Rth1 that is internally recorded in advance and does not take into account a temperature rise.

$$Rth\_x = Rth1 + f(\Delta T) \tag{9}$$

As described below, a failure of the relay can accurately be diagnosed based on the threshold Rth_x set as the variable value in accordance with the temperature change amount $\Delta T$ of the relay.

The configuration in which the temperature drift of the contact resistance is calculated using the contact resistance initial value R12_cont_ini and the current value I_pack has been described. However, a temperature sensor that detects the temperature of the relay may be provided, and the temperature change amount ($\Delta T$) of the relay may be calculated using a temperature measured by the temperature sensor. For example, a difference between the temperature measured by the temperature sensor 25 and the temperature at the time of obtaining the initial value R12_cont_ini of the contact resistance R12_cont is calculated.

Calculation of Contact Resistance of Negative Electrode-side Main Relay

Figure 3:
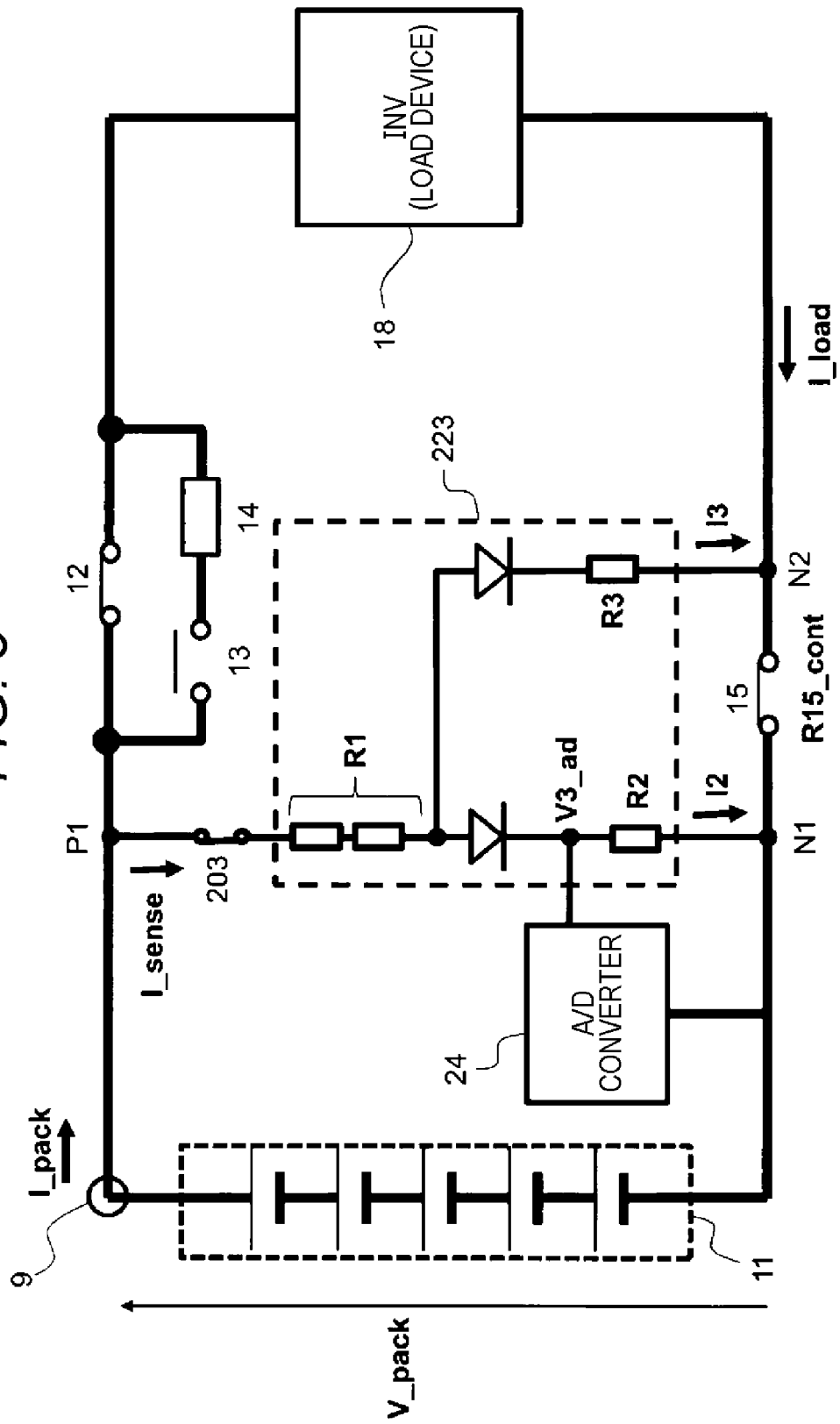
FIG. 3 is a diagram illustrating a third voltage measurement system.

The calculation of the contact resistance R15_cont of the negative electrode-side main relay 15 will be described below with reference to FIG. 3. FIG. 3 illustrates a voltage measurement system (hereinafter, referred to as a third voltage measurement system) of the voltage (that is, the third voltage) between the first positive electrode contact P1 and the second negative electrode contact N2. The third voltage measurement system includes the changeover switch 203, the interface circuit 223, and the A/D converter 24. In FIG. 3, V_pack is a voltage of the battery pack 11, I_load is a current flowing through the inverter 18 which is the load device, and I_sense is a current flowing through the third voltage measurement system. FIG. 3 illustrates a case where the battery pack 11 is in a discharging state.

In FIG. 3, the voltage between the first positive electrode contact P1 and the first negative electrode contact N1 is V_pack, and the voltage between the first positive electrode contact P1 and the second negative electrode contact N2 is the above-described third voltage. Assuming that the contact resistance of the negative electrode-side main relay 15 is R15_cont, the third voltage is smaller than the voltage V_pack by the voltage drop at the contact resistance R15_cont.

In the interface circuit 223, the current I_sense having passed through the resistance R1 is branched into a current I2 flowing through the resistance R2 and a current I3 flowing through the resistance R3. The current I2 passes through the resistance R2 and reaches the first negative electrode contact N1. On the other hand, the current I3 having passed through the resistance R3 merges with the current I_load at the second negative electrode contact N2. A current (I3+I_load)=(I3+I_pack−I_sense) after merging passes through the negative electrode-side main relay 15 and reaches the first negative electrode contact N1. At the first negative electrode contact N1, the current I2 and the current (I3+I_pack−I_sense) are merged, and the merged current I_pack flows through the battery pack 11.

Here, as for considering a combined resistance R with which a resistance (R3+R15_cont) and the resistance R2 connected in series are connected in parallel, it can be considered that the voltage V_pack between the first positive electrode contact P1 and the first negative electrode contact N1 is divided by the combined resistance R and the resistance R1, and the voltage V3_ad to be applied to the combined resistance R is measured by the A/D converter 24. The combined resistance R is given by the following equation (10).

$$R = R2 \times (R3 + R15\_cont)/(R2 + R3 + R15\_cont) \tag{10}$$

The voltage V3_ad measured by the A/D converter 24 is expressed by the following equation (11) using the voltage V_pack between the first positive electrode contact P1 and the first negative electrode contact N1 and the resistances R1 and R. When the equation (11) is transformed, the combined resistance R is expressed by the equation (12). Note that V_pack is expressed as V_pack=$\alpha 1 \times$V1_ad using the voltage V1_ad measured by the first voltage measurement system as described above.

$$V3\_ad = V\_pack \times R/(R1+R) \tag{11}$$

$$R = V3\_ad \times R1/(V\_pack - V3\_ad) \tag{12}$$

Since the right side of the equation (12) is equal to the right side of the equation (10), the following equation (13) holds. When the equation (13) is transformed, the contact resistance R15_cont is expressed by the following equation (14). In the equation (14), F and G on the right side are amounts calculated by the resistances R1 to R3 and the measurement values V_pack and V3_ad as expressed in the equation (15) and (16).

$$V3\_ad \times R1/(V\_pack - V3\_ad) = R2 \times (R3 + R15\_cont)/(R2 + R3 + R15\_cont) \tag{13}$$

$$R15\_cont = F/G \tag{14}$$

However, $$F = R2 \times R3 \times V\_pack - V3\_ad \times (R1 \times R2 + R2 \times R3 + R3 \times R1) \tag{15}$$

$$G = (R1+R2) \times V3\_ad - R2 \times V\_pack \tag{16}$$

That is, the microcomputer 2 can accurately calculate the contact resistance R15_cont of the negative electrode-side main relay 15 also in the energized state by applying the measured voltage V_pack, the voltage V1_ad, the voltage V3_ad, and the preset resistances R1, R2, and R3 to the equation (14). This calculation can be performed in both cases where the current I_load flows and does not flow through the inverter 18. In the above description, the case where the battery pack 11 is in the discharged state has been described, and the contact resistance R15_cont can be similarly calculated also in the case of the charged state although the description is omitted.

As described above, the measured voltages V1_ad and V2_ad, the current I_pack, and the current I_sense, which is the calculation value are used for calculating the contact resistance R12_cont, and the measured voltages V1_ad and V3_ad are used for calculating the contact resistance R15_cont. In this case, for example, when the measurement timings of the voltages V1_ad and V2_ad and the current I_pack are greatly deviated, the state during the measurement varies and the calculated value of the contact resistance R12_cont might be greatly deviated from an actual value. Therefore, the voltages V1_ad and V2_ad and the current I_pack are measured in synchronization, and it is necessary to calculate the value of the contact resistance using the simultaneously measured data. Similarly, in the case of calculating the contact resistance R15_cont, it is necessary to measure the voltages V1_ad and V3_ad in synchronization. In the charge and discharge control of the battery pack 11, simultaneity of about 1 msec, that is, simultaneity to the extent that all measurements are completed within about 1 msec is required. Note that the updating cycle of these measurements is about 10 msec to 100 msec.

In order to eliminate the influence of a measurement error due to inverter noise or the like, an RC filter or the like is used, but a constant of such a filter also has to have similar filter characteristics between voltages and current measurement circuits. In a case where commonality of the filter using the circuit constant is not enabled, the commonality may be achieved by a software filter in accordance with signal processing inside the microcomputer.

As described above, in the present exemplary embodiment, for example, as for the positive electrode-side main relay 12 as the first relay connected between the positive electrode terminal of the battery pack 11 and the inverter 18 as the load device, the contact resistance R12_cont of the positive electrode-side main relay 12 is obtained by calculation based on the first voltage between the battery pack-side contact (the first positive electrode contact P1) of the positive electrode-side main relay 12 and the negative electrode-side terminal (the first negative electrode contact N1) of the battery pack 11, and the second voltage between the load side contact (the second positive electrode contact P2) of the positive electrode-side main relay 12 and the negative electrode-side terminal of the battery pack 11. Therefore, the contact resistance R12_cont can be accurately obtained also in the energized state, and the state of the positive electrode-side main relay 12, for example, whether the relay contact is welded can be accurately understood based on the calculated contact resistance R12_cont.

Further, in addition to the positive electrode-side main relay 12, the negative electrode-side main relay 15 as the second relay connected between the other terminal (negative electrode-side terminal) of the battery pack 11 and the inverter 18 is provided between the battery pack 11 and the inverter 18. The third voltage measurement system that measures the third voltage between the load-side contact of the negative electrode-side main relay 15 and one terminal (positive electrode-side terminal) of the battery pack 11 is further provided. The microcomputer 2 can accurately calculate the contact resistance R15_cont of the negative electrode-side main relay 15 based on the first voltage and the third voltage.

Updating of Threshold of Negative Electrode-side Main Relay

Next, updating of a threshold during I_pack energization will be described. After the negative electrode-side main relay 15 is energized, an initial value R15_cont_ini of the contact resistance R15_cont measured immediately before the current energization is stored in the internal memory of the microcomputer 2.

The power consumption of the contact resistance R15_cont during the current I_pack energization can be calculated in a similar manner the equation (6).

The microcomputer 2 can calculate a calorific value Q2 of the contact resistance R15_cont in the similar manner as the equation (7) by integrating the calculated power consumption.

A temperature change amount $\Delta T'$ of the negative electrode-side main relay 15 can be estimated in accordance with a similar equation to the equation (8) by using the calculated calorific value Q2 and a temperature conversion parameter K' recorded in advance in the microcomputer 2.

The microcomputer 2 calculates a temperature drift $f(\Delta T')$ of the contact resistance value based on the calculated temperature change amount $\Delta T'$ and the contact resistance initial value R15_cont_ini using a temperature characteristic table of the contact resistance R15_cont internally recorded in advance or a conversion function.

The microcomputer 2 obtains a threshold Rth_x' in which the temperature drift $f(\Delta T')$ of the contact resistance is added in accordance with the equation (9) for adding the calculated temperature drift $f(\Delta T')$ to an initial threshold Rth_1' that is internally recorded in advance. Note that the initial threshold Rth_1' is a threshold for normality determination of the contact resistance in which a temperature rise is not taken into consideration.

A failure of the relay can accurately be diagnosed based on the threshold Rth_x' set as a variable value in accordance with the temperature change amount $\Delta T'$ of the relay in a similar manner to the diagnosis of the positive electrode-side main relay 12, described below.

Therefore, the contact resistance R15_cont can be accurately obtained also in the energized state, and the state of the negative electrode-side main relay 15, for example, whether the relay contact is welded can be accurately understood based on the calculated contact resistance R15_cont.

Diagnosis of Failure of Relay

As described above, since the microcomputer 2 can calculate the contact resistance R12_cont of the positive electrode-side main relay 12 and the contact resistance R15_cont of the negative electrode-side main relay 15, failures of the positive electrode-side main relay 12 and the negative electrode-side main relay 15 can be diagnosed by using the calculation results. The positive electrode-side main relay 12 and the negative electrode-side main relay 15 are diagnosed individually, but the diagnosis of the positive electrode-side main relay 12 will be described here.

The contact resistance R12_cont of the positive electrode-side main relay 12 in the energized state has a small value of about 100 $\mu\Omega$ in the normal state. Further, also when the relay contact is welded, the contact resistance R12_cont becomes very small. In addition, when an oxide film, an inclusion, or the like is present at the contact portion of the relay contact, the contact resistance R12_cont increases. Note that the contact resistance R12_cont also depends on the temperature of the contact, and the contact resistance R12_cont also increases as the temperature increases. That is, since the temperature of the relay contact is higher in the energized state due to Joule heat than in the non-energized state, the contact resistance R12_cont also increases accordingly.

On the other hand, since the contact resistance R12_cont of the positive electrode-side main relay 12 in the open state has a large value in the normal state, that is 1000 MΩ or more, abnormality of the relay can be easily detected when welding of the contact portion occurs.

FIGS. 4(A) to 4(C) are diagrams illustrating examples of thresholds for failure diagnosis of the relay. FIG. 4(A) illustrates a case where the temperature change amount (ΔT) is 0° C., FIG. 4(B) illustrates a case where the temperature change amount (ΔT) is higher than 0° C. and 20° C. or less, and FIG. 4(C) illustrates a case where the temperature change amount (ΔT) is higher than 20° C. The horizontal axis in each drawing indicates the contact resistance of the relay.

As illustrated in FIGS. 4(A) to 4(C), the threshold is set in accordance with the temperature change amount (ΔT) of the relay. As described above, since the contact resistance value also increases due to the temperature rise during energization, the thresholds Rth1_1 and Rth1_2 during energization are set larger than the initial threshold Rth1 during non-energization by ΔR1 and ΔR2, respectively. For example, the thresholds Rth1_1 and Rth1_2 are set stepwise from the initial threshold Rth1 in accordance with the temperature change amount (ΔT), and the state of the relay can be diagnosed in accordance with a use condition.

For example, when the temperature change amount (ΔT) is 0° C., the diagnosis is performed by using the initial threshold Rth1 during non-energization. As illustrated in FIG. 4(A), when the calculated contact resistance R12_cont satisfies R12_cont<Rth1, it is diagnosed as a normal state, and when the calculated contact resistance R12_cont satisfies R12_cont≥Rth1, it is diagnosed as abnormal because the contact resistance of the relay is high.

Further, in a case where the temperature change amount (ΔT) is greater than 0☐ and 20☐ or lower, as illustrated in FIG. 4(B), when the calculated contact resistance R12_cont satisfies R12_cont<Rth1_1, it is diagnosed as the normal state, and when the calculated contact resistance R12_cont satisfies R12_cont≥Rth1_1, it is diagnosed as abnormal because the contact resistance of the relay is high.

Further, in a case where the temperature change amount (ΔT) is higher than 20☐, as illustrated in FIG. 4(C), when the calculated contact resistance R12_cont satisfies R12_cont<Rth1_2, it is diagnosed as the normal state, and when the calculated contact resistance R12_cont satisfies R12_cont≥Rth1_2, it is diagnosed as abnormal because the contact resistance of the relay is high.

The threshold Rth_3 is a threshold for determining relay welding as described later during non-energization. In a failure mode in which the current sensor 9 that measures the charge and discharge current I_pack fails, the diagnosis is performed using a threshold Rth2 greater than the initial threshold Rth1 and smaller than a threshold Rth3.

Figure 4:
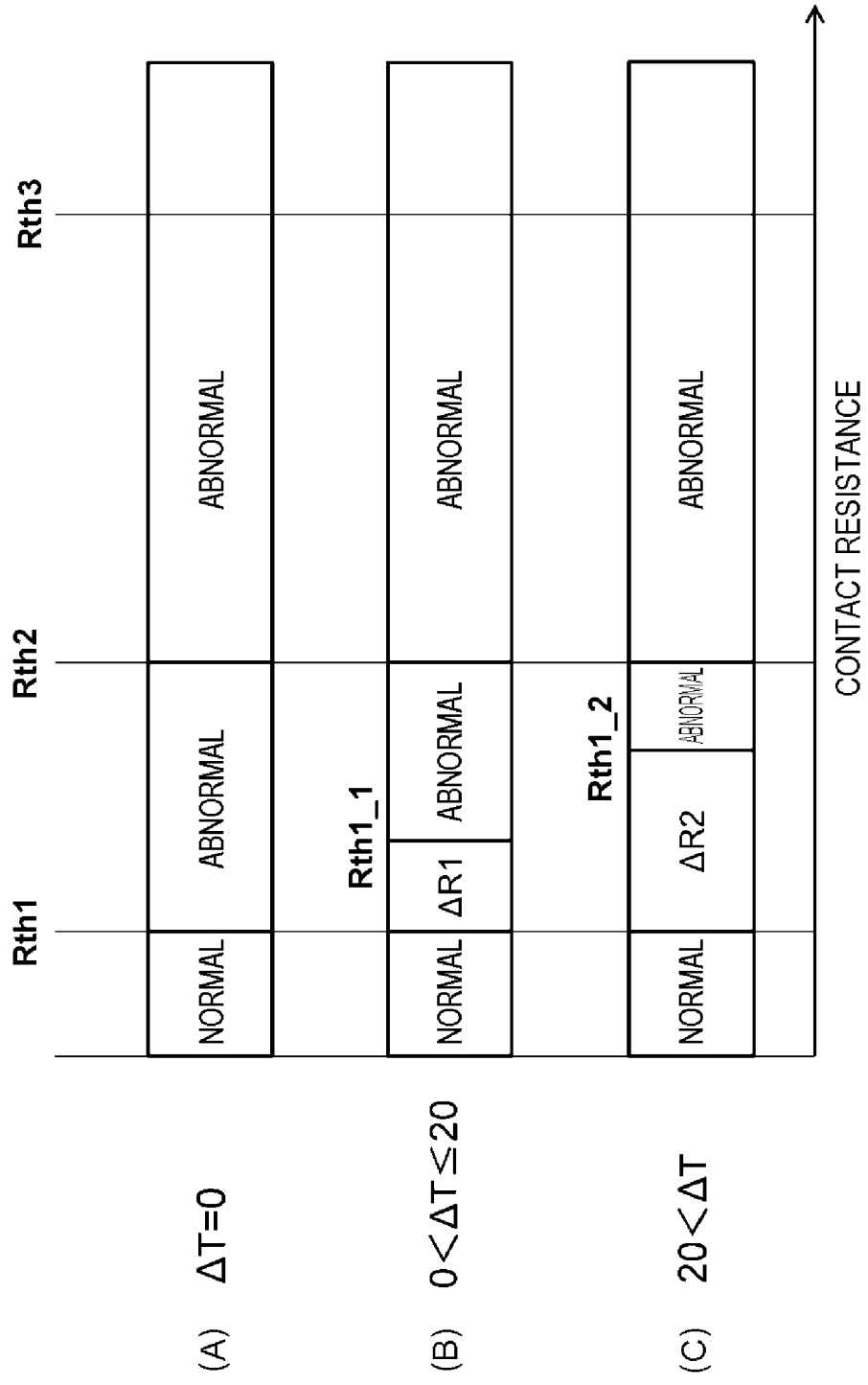
FIGS. 4(A) to 4(C) are diagrams illustrating examples of thresholds for failure diagnosis of a relay.

In FIG. 4, in order to simplify the description, the case has been described in which the thresholds are diagnosed under the conditions of four stages of Rth1, Rth1_1, Rth1_2, and Rth2. However, the threshold Rth1_x during current application is set to a value that is variable in an analog fashion in accordance with the temperature change amount (ΔT).

In such a manner, by selectively using the threshold depending on the temperature change amount (ΔT) and depending on whether the state is the energized state or the non-energized state, more accurate diagnosis can be performed in consideration of the welding state of the relay contact.

Figure 5:
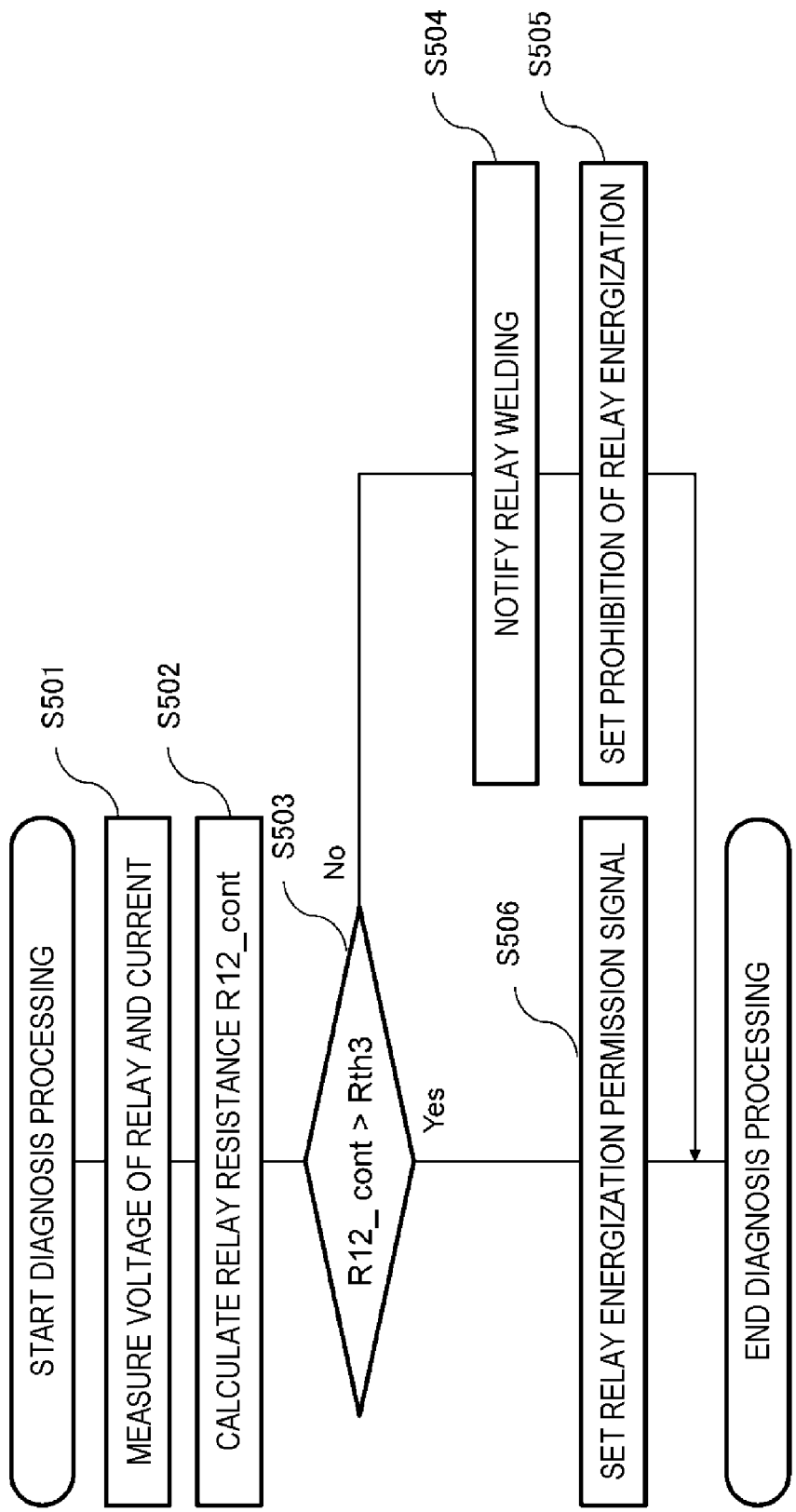
FIG. 5 is a flowchart illustrating an operation of a microcomputer before start of a closing operation of the relay.

FIG. 5 is a flowchart illustrating relay diagnosis processing performed by the microcomputer 2 before start of a closing operation of the relay. With reference to FIG. 5, the positive electrode-side main relay 12 will be described, but the same applies to the negative electrode-side main relay 15.

In step S501 of FIG. 5, as already described, the voltage of the positive electrode-side main relay 12 and the current flowing through the secondary battery are measured before the start of the relay closing operation, that is, during non-energization. In next step S502, the contact resistance R12_cont of the positive electrode-side main relay 12 is calculated based on the measured voltage and current.

In next step S503, the calculated contact resistance R12_cont is compared with the threshold Rth3. In a case where the contact resistance R12_cont is not greater than the threshold Rth3, the processing proceeds to step S504.

In step S504, since the contact resistance R12_cont is not greater than the threshold Rth3 before the start of the relay closing operation, a diagnosis is made that the positive electrode-side main relay 12 is welded, and the welded state of the positive electrode-side main relay 12 is notified to a host control device, not illustrated. In next step S505, the microcomputer 2 stores a state in which the energization (CLOSE) of the positive electrode-side main relay 12 is prohibited. The processing then ends without energizing the positive electrode-side main relay 12. When receiving a command to energize the positive electrode-side main relay 12 from a host control device, not illustrated, or the like, the microcomputer 2 does not energize the positive electrode-side main relay 12 as long as energization prohibition of the positive electrode-side main relay 12 is stored. This protects the secondary battery.

In a case where the determination is made in step S503 that the contact resistance R12_cont is greater than the threshold Rth3, the processing proceeds to step S506. In step S506, a determination is made based on the diagnosis result that there is no relay welding, an energization permission signal for the positive electrode-side main relay 12 is set. That is, in a case where the positive electrode-side main relay 12 is set to the energization permitted state and a command to close the positive electrode-side main relay 12 is received from the host control device or the like, the positive electrode-side main relay 12 is closed.

Figure 6:
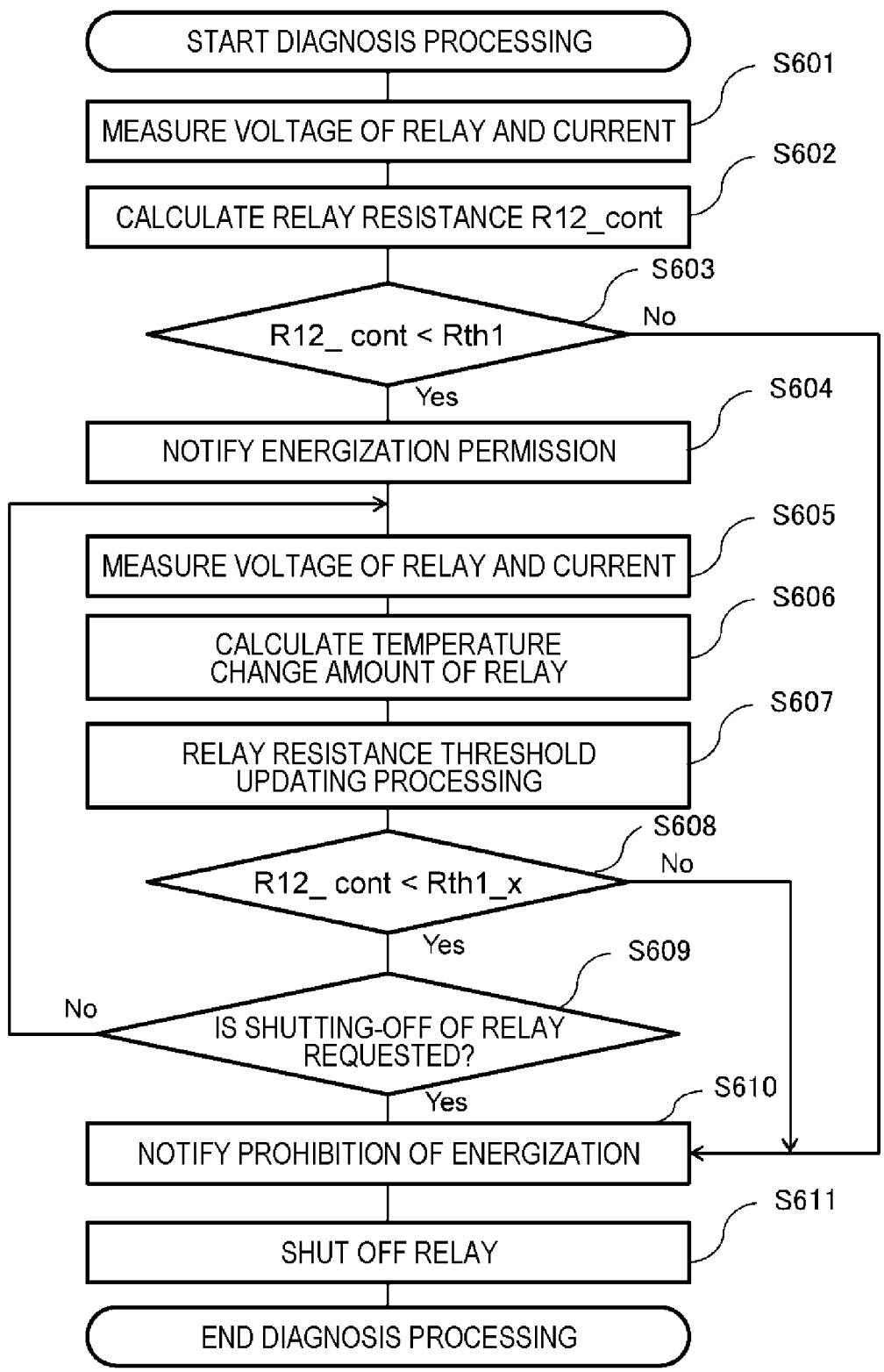
FIG. 6 is a flowchart illustrating an operation of the microcomputer during the closing operation of the relay.

FIG. 6 is a flowchart illustrating the relay diagnosis processing performed by the microcomputer 2 during the relay closing operation. With reference to FIG. 6, the positive electrode-side main relay 12 will be described, but the same applies to the negative electrode-side main relay 15.

In step S601 of FIG. 6, as already described, the voltage of the positive electrode-side main relay 12 and the current flowing through the secondary battery are measured immediately after the relay closing operation, that is, immediately after energization. In next step S602, the contact resistance R12_cont of the positive electrode-side main relay 12 is calculated based on the measured voltage and current.

In next step S603, the contact resistance R12_cont immediately after the relay closing operation is compared with the initial threshold Rth1. In a case where the contact resistance R12_cont is smaller than the initial threshold Rth1, that is, in a case where a determined is made that the resistance value of the positive electrode-side main relay 12 is normal, the processing proceeds to step S604.

In step S604, permission to energize the positive electrode-side main relay 12 is notified to the host control device, and the normal operation is started.

In next step S605, the voltage of the positive electrode-side main relay 12 and the current flowing through the secondary battery are measured. Then, in next step S606, the temperature change amount ΔT of the positive electrode-side main relay 12 is calculated by the equation (8) as described above. Further, in next step S607, the threshold Rth_x of the positive electrode-side main relay 12 is updated in accordance with the equation (9) as described above.

In next step S608, a determination is made whether the contact resistance R12_cont of the positive electrode-side main relay 12 is smaller than the updated threshold Rth_x. When the contact resistance R12_cont is smaller than the threshold Rth_x, the positive electrode-side main relay 12 is normal, and the processing proceeds to step S609.

In step S609, a determination is made whether a request for shutting off the positive electrode-side main relay 12 is made. When the request is not made, the processing returns to step S605, and the processing in and after step S605 is repeated to compare the contact resistance R12_cont of the positive electrode-side main relay 12 with the updated threshold Rth_x, based on the temperature change amount ΔT.

When the determination is made in step S603 that the contact resistance R12_cont is greater than or equal to the initial threshold Rth1, that is, when the resistance value of the positive electrode-side main relay 12 is greater than or equal to the initial threshold Rth1 immediately after the relay closing operation, the positive electrode-side main relay 12 is determined as abnormal, and the processing proceeds to step S610.

When the determination is made in step S608 that the contact resistance R12_cont of the positive electrode-side main relay 12 is greater than or equal to the updated threshold Rth_x, based on the temperature change amount ΔT, the positive electrode-side main relay 12 is determined as abnormal, and the processing proceeds to step S610.

In step S610, the host control device, not illustrated, is notified of prohibition of energization to the positive electrode-side main relay 12. Thereafter, the processing proceeds to step S611, where the positive electrode-side main relay 12 is shut off to prevent welding of the relay.

FIGS. 5 and 6 are flowcharts illustrating the processing of the microcomputer 2 that operates as the relay control device, but the program shown in this flowchart can be executed by a computer including a central processing unit (CPU), a memory, and the like. The entire or partial processing may be achieved by a hard logic circuit. Further, this program can be provided by being stored in advance in a storage medium of a diagnosis control device. Alternatively, the program may be stored in an independent storage medium to be provided, or the program may be recorded and stored in a storage medium of the diagnosis control device by a network line. Various forms of computer-readable computer program products, such as data signals (carrier waves), may be provided.

According to the exemplary embodiment described above, the following operational effects can be obtained.

(1) The relay control device (microcomputer 2) controls the relay (the positive electrode-side main relay 12 and the negative electrode-side main relay 15) connected between the secondary battery and the load device. The relay control device (microcomputer 2) calculates, in the failure diagnosis during energization with the relay being closed, the contact resistance values R12_cont and R15_cont of the relay based on the voltage applied to the relay and the current flowing through the secondary battery, determines the first threshold Rth1 set as a variable value in accordance with the temperature change amount ΔT of the relay, and compares the calculated contact resistance values R12_cont and R15_cont with the first threshold Rth1 to diagnose a failure of the relay. As a result, the contact resistance of the relay can be accurately calculated also during energization and failure diagnosis of the relay can be accurately performed.

(2) With the method of controlling the relay control device (microcomputer 2) of the present invention, the relay (the positive electrode-side main relay 12 and the negative electrode-side main relay 15) connected between the secondary battery and the load device are controlled. With the method of controlling the relay control device (microcomputer 2) includes, in the failure diagnosis during energization with the relay being closed, the contact resistance values R12_cont and R15_cont of the relay are calculated based on the voltage applied to the relay and the current flowing through the secondary battery, the first threshold Rth1 is set as a variable value in accordance with the temperature change amount ΔT of the relay, and the calculated contact resistance values R12_cont and R15_cont are compared with the first threshold Rth1 to perform failure diagnosis of the relay. As a result, the contact resistance of the relay can be accurately calculated also during energization and failure diagnosis of the relay can be accurately performed.

The present invention is not limited to the above-described embodiment, and other forms conceivable within the scope of the technical idea of the present invention are also included within the scope of the present invention as long as the features of the present invention are not impaired.

REFERENCE SIGNS LIST 1 power supply IC
2 microcomputer
5 cell voltage monitoring IC
7 relay control unit
9 current sensor
11 battery pack
12 positive electrode-side main relay
13 precharge relay
15 negative electrode-side main relay
18 inverter
20 sensor connection changeover switch group
22 high-voltage measurement interface circuit group
23 battery monitoring device
24 A/D converter
25 temperature sensor
201 changeover switch
202 changeover switch
203 changeover switch
221 interface circuit
222 interface circuit
223 interface circuit
N1 first negative electrode contact
N2 second negative electrode contact
P1 first positive electrode contact
P2 second positive electrode contact
R12_cont, R15_cont contact resistance
Rth1, Rth1_1, Rth1_2, Rth2, Rth3 threshold

The invention claimed is:

1. A relay control device that controls a relay connected between a secondary battery and a load device, the relay control device configured to
calculate, in a failure diagnosis during energization immediately after the relay is closed, a contact resistance value of the relay based on a voltage applied to the relay and a current flowing through the secondary battery, set the relay to an energization permitted state when a determination is made that the contact resistance value of the relay is smaller than an initial threshold, determine, during energization when the energization permitted state is set, a first threshold set as a variable value in accordance with a temperature change amount of the relay by adding an increase in resistance based on the temperature change amount of the relay to the initial threshold, and compare the calculated contact resistance value with the first threshold to diagnose a failure of the relay.

2. The relay control device according to claim 1, wherein the temperature change amount of the relay is calculated based on a calorific value obtained based on the contact resistance value of the relay and the current flowing through the secondary battery.

3. The relay control device according to claim 1, comprising:

a temperature sensor that detects a temperature of the relay, wherein the temperature change amount of the relay is calculated using the temperature measured by the temperature sensor.

4. The relay control device according to claim 1, wherein the relay is diagnosed as normal when the contact resistance value is smaller than the first threshold, and the relay is diagnosed as faulty when the contact resistance value is greater than or equal to the first threshold.

5. The relay control device according to claim 4, configured to calculate, in a failure diagnosis during non-energization before the relay is closed, a contact resistance value of the relay based on a voltage applied to the relay and a current flowing through the secondary battery, and set the relay to an energization permitted state when a determination is made that the contact resistance value of the relay is greater than a predetermined second threshold greater than the first threshold.

6. A method of controlling a relay control device that controls a relay connected between a secondary battery and a load device, the method comprising:

calculating, in a failure diagnosis during energization immediately after the relay is closed, a contact resistance value of the relay based on a voltage applied to the relay and a current flowing through the secondary battery, setting the relay to an energization permitted state when a determination is made that the contact resistance value of the relay is smaller than an initial threshold, determining, when the permitted state is set in the failure diagnosis during energization, a first threshold set as a variable value in accordance with adding a resistance based on a temperature change amount of the relay to the initial threshold, and comparing the calculated contact resistance value with the first threshold to diagnose a failure of the relay.

7. The method of controlling the relay control device according to claim 6, wherein the temperature change amount of the relay is calculated based on a calorific value obtained based on the contact resistance value of the relay and the current flowing through the secondary battery.

8. The method of controlling the relay control device according to claim 6, wherein the relay is diagnosed as normal when the contact resistance value is smaller than the first threshold, and the relay is diagnosed as faulty when the contact resistance value is greater than or equal to the first threshold.

* * * * *